(12) United States Patent
Mitsuya et al.

(10) Patent No.: US 8,618,728 B2
(45) Date of Patent: Dec. 31, 2013

(54) LIGHT-EMITTING DEVICE, DISPLAY DEVICE, AND ELECTRONIC APPARATUS

(75) Inventors: Masayuki Mitsuya, Chino (JP); Masahisa Otake, Chino (JP)

(73) Assignee: Seiko Epson Corporation, Tokyo (JP)

( * ) Notice: Subject to any disclaimer, the term of this patent is extended or adjusted under 35 U.S.C. 154(b) by 92 days.

(21) Appl. No.: 12/946,962

(22) Filed: Nov. 16, 2010

(65) Prior Publication Data

US 2011/0127906 A1 Jun. 2, 2011

(30) Foreign Application Priority Data

Nov. 27, 2009 (JP) ................. 2009-270767

(51) Int. Cl.
*H05B 33/00* (2006.01)
*H01J 1/62* (2006.01)

(52) U.S. Cl.
USPC .......................................... 313/504; 313/506

(58) Field of Classification Search
USPC ................................................. 313/498–512
See application file for complete search history.

(56) References Cited

U.S. PATENT DOCUMENTS

| 2002/0086180 A1 | 7/2002 | Seo et al. |
| 2003/0170491 A1* | 9/2003 | Liao et al. ................ 428/690 |
| 2003/0189401 A1 | 10/2003 | Kido et al. |
| 2005/0260440 A1 | 11/2005 | Seo et al. |
| 2006/0220534 A1 | 10/2006 | Shibanuma et al. |
| 2006/0289882 A1 | 12/2006 | Nishimura et al. |
| 2007/0024168 A1 | 2/2007 | Nishimura et al. |
| 2007/0035238 A1 | 2/2007 | Nakagawa |
| 2008/0036369 A1 | 2/2008 | Tokuda et al. |
| 2009/0273280 A1 | 11/2009 | Seo et al. |
| 2011/0057179 A1 | 3/2011 | Nowatari et al. |

FOREIGN PATENT DOCUMENTS

| JP | A-2002-313583 | 10/2002 |
| JP | A-2003-272860 | 9/2003 |
| JP | A-2006-172762 | 6/2006 |
| JP | A-2006-351398 | 12/2006 |
| JP | A-2007-059848 | 3/2007 |
| JP | A-2007-265638 | 10/2007 |
| JP | A-2008-165988 | 7/2008 |
| JP | A-2009-500790 | 1/2009 |
| JP | A-2011-077034 | 4/2011 |
| WO | WO 2007/055200 A1 | 1/2007 |

\* cited by examiner

*Primary Examiner* — Joseph L Williams
(74) *Attorney, Agent, or Firm* — Oliff & Berridge, PLC

(57) ABSTRACT

A light-emitting device includes an anode; a cathode; a first light-emitting unit provided between the anode and the cathode and having at least one light-emitting layer; a second light-emitting unit provided between the cathode and the first light-emitting unit and having at least one light-emitting layer; and a carrier generation layer provided between the first light-emitting unit and the second light-emitting unit, the carrier generation layer generating holes and electrons in response to application of a voltage between the anode and the cathode. The carrier generation layer includes an n-type electron transport layer and an electron-withdrawing layer, the n-type electron transport layer being positioned between the first light-emitting unit and the electron-withdrawing layer and containing alkali metal oxide and an electron-transporting material having electron transport properties, the electron-withdrawing layer contacting the n-type electron transport layer and containing organic cyanide having an aromatic ring.

8 Claims, 4 Drawing Sheets

1

LIGHT-EMITTING DEVICE, DISPLAY DEVICE, AND ELECTRONIC APPARATUS

BACKGROUND

1. Technical Field

The present invention relates to a light-emitting device, a display device, and an electronic apparatus.

2. Related Art

An organic electroluminescence (EL) device is a light-emitting device, which has a configuration in which at least one organic light-emitting layer is disposed between an anode and a cathode. In such a light-emitting device, an electric field is applied between the cathode and the anode with the result that electrons are injected from the cathode to the light-emitting layer and that holes are injected from the anode to the light-emitting layer. Then, the electrons recombine with the holes in the light-emitting layer with the result that the excitons are generated. The excitons return to a ground state and thereby generate energy, and the energy is released in the form of light.

Examples of such a light-emitting device include one of a type in which at least two light-emitting units (light-emitting sections) having light-emitting layers are provided between a cathode and an anode and in which a carrier generation layer is provided as an intermediate layer between the light-emitting units, the carrier generation layer having a function of generating carriers (electrons and holes) (for example, see JP-A-2003-272860).

In such a light-emitting device, an electric field is applied between the anode and the cathode with the result that electrons and holes are generated from the carrier generation layer. Therefore, the electrons and holes are supplied to the light-emitting layers included in the light-emitting units that are provided so as to be positioned adjacent to the carrier generation layer. Accordingly, in addition to the holes and electrons that are respectively supplied from the anode and the cathode, the electrons and holes that are supplied from the carrier generation layer are also used to emit light from the light-emitting layer included in each of the light-emitting units. Consequently, in cases where a constant current is applied to such a light-emitting device, the light-emitting device is capable of emitting light with high luminance and has excellent light emission efficiency, as compared with a light-emitting device having one light-emitting layer. Furthermore, also in cases where such a light-emitting device is used at a low current, light is capable of being emitted with relatively high luminance, and therefore the performance of the light-emitting device is less degraded, and relatively long emission lifetime is provided.

However, in such a light-emitting device, a metal oxide such as $V_2O_5$ or indium tin oxide (ITO) is used as a material of the carrier generation layer (intermediate layer). Therefore, a driving voltage of the light-emitting device is increased. In addition, the metal oxide contained in the carrier generation layer reacts with organic materials contained in the light-emitting units with the result that a problem is caused in that the lifetime of the light-emitting device is decreased.

SUMMARY

An advantage of some aspects of the invention is that it provides a light-emitting device having excellent light-emitting properties and lifetime properties and provides a display device and an electronic apparatus each including such a light-emitting device and having high reliability.

According to an aspect of the invention, there is provided a light-emitting device including: an anode; a cathode; a first light-emitting unit provided between the anode and the cathode, the first light-emitting unit having at least one light-emitting layer that emits light in response to application of a voltage between the anode and the cathode; a second light-emitting unit provided between the cathode and the first light-emitting unit, the second light-emitting unit having at least one light-emitting layer that emits light in response to application of a voltage between the anode and the cathode; and a carrier generation layer provided between the first light-emitting unit and the second light-emitting unit, the carrier generation layer generating holes and electrons in response to application of a voltage between the anode and the cathode. The carrier generation layer includes an n-type electron transport layer and an electron-withdrawing layer, the n-type electron transport layer being positioned between_the first light-emitting unit and the electron-withdrawing layer and containing alkali metal oxide and an electron-transporting material having electron transport properties, the electron-withdrawing layer contacting the n-type electron transport layer and containing organic cyanide having an aromatic ring.

By virtue of this advantage, the light-emitting device has both excellent light-emitting properties and lifetime properties.

In the light-emitting device according to an aspect of the invention, it is preferable that the alkali metal oxide is lithium oxide.

Li has an especially low work function among alkali metals, and therefore the oxide of such a metal has a function of further efficiently withdrawing electrons, which are generated in the electron-withdrawing layer, toward the n-type electron transport layer. In addition, the lithium oxide, which is one type of oxide, is stable in air and enables a material to be easily changed in a film formation apparatus.

In the light-emitting device according to an aspect of the invention, it is preferable that the alkali metal oxide content decreases from the side of the electron-withdrawing layer to the side of the anode.

By virtue of this advantage, the electrons generated in the electron-withdrawing layer are further efficiently withdrawn toward the n-type electron transport layer, and deactivation of excitors generated in the light-emitting layer is capable of being suppressed, thereby providing excellent light-emitting properties.

In the light-emitting device according to an aspect of the invention, it is preferable that a content ratio (volume ratio) of the alkali metal oxide in the n-type electron transport layer is in the range from 0.4 to 14%.

By virtue of this advantage, the electrons generated in the electron-withdrawing layer are further efficiently withdrawn toward the n-type electron transport layer, and the electrons are transported through the n-type electron transport layer and are capable of being finally injected into an adjacent layer in a more efficient manner.

In the light-emitting device according to an aspect of the invention, it is preferable that the n-type electron transport layer has an average thickness that is in the range from 5 to 60 nm.

By virtue of this advantage, a driving voltage of the light-emitting device is prevented from being increased, and the n-type electron transport layer is capable of sufficiently functioning.

In the light-emitting device according to an aspect of the invention, it is preferable that each of the first light-emitting unit and the second light-emitting unit includes a hole transport layer and an electron transport layer, the hole transport layer being positioned on the side of the anode, and the electron transport layer being positioned on the side of the cathode.

In the light-emitting device according to an aspect of the invention, it is preferable that the electron-transporting material contained in the n-type electron transport layer is similar or identical to an electron-transporting material contained in the electron transport layer included in the first light-emitting unit.

By virtue of this advantage, the electrons are capable of being further efficiently injected from the n-type electron transport layer into an adjacent layer.

In the light-emitting device according to an aspect of the invention, it is preferable that the organic cyanide is a hexaazatriphenylene derivative.

Such a compound has a function which is inherent in the organic cyanide having an aromatic ring and namely has especially excellent electron-withdrawing characteristics. Accordingly, such a compound is capable of more sufficiently withdrawing electrons from the adjacent layer and is capable of more certainly transporting the withdrawn electrons to the n-type electron transport layer.

In the light-emitting device according to an aspect of the invention, it is preferable that the electron-withdrawing layer has an average thickness that is in the range from 5 to 40 nm.

By virtue of this advantage, a driving voltage of the light-emitting device is prevented from being increased, and the electron-withdrawing layer is capable of sufficiently functioning.

According to another aspect of the invention, there is provided a display device including the light-emitting device having the above advantages.

By virtue of this advantage, a highly reliable display device is capable of being provided.

According to another aspect of the invention, there is provided an electronic apparatus including the display device having the above advantage.

By virtue of this advantage, a highly reliable electronic apparatus is capable of being provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of a light-emitting device, a display device, and an electronic apparatus according to an embodiment of the invention will be described with reference to the accompanying drawings.

Light-Emitting Device

Figure 1:
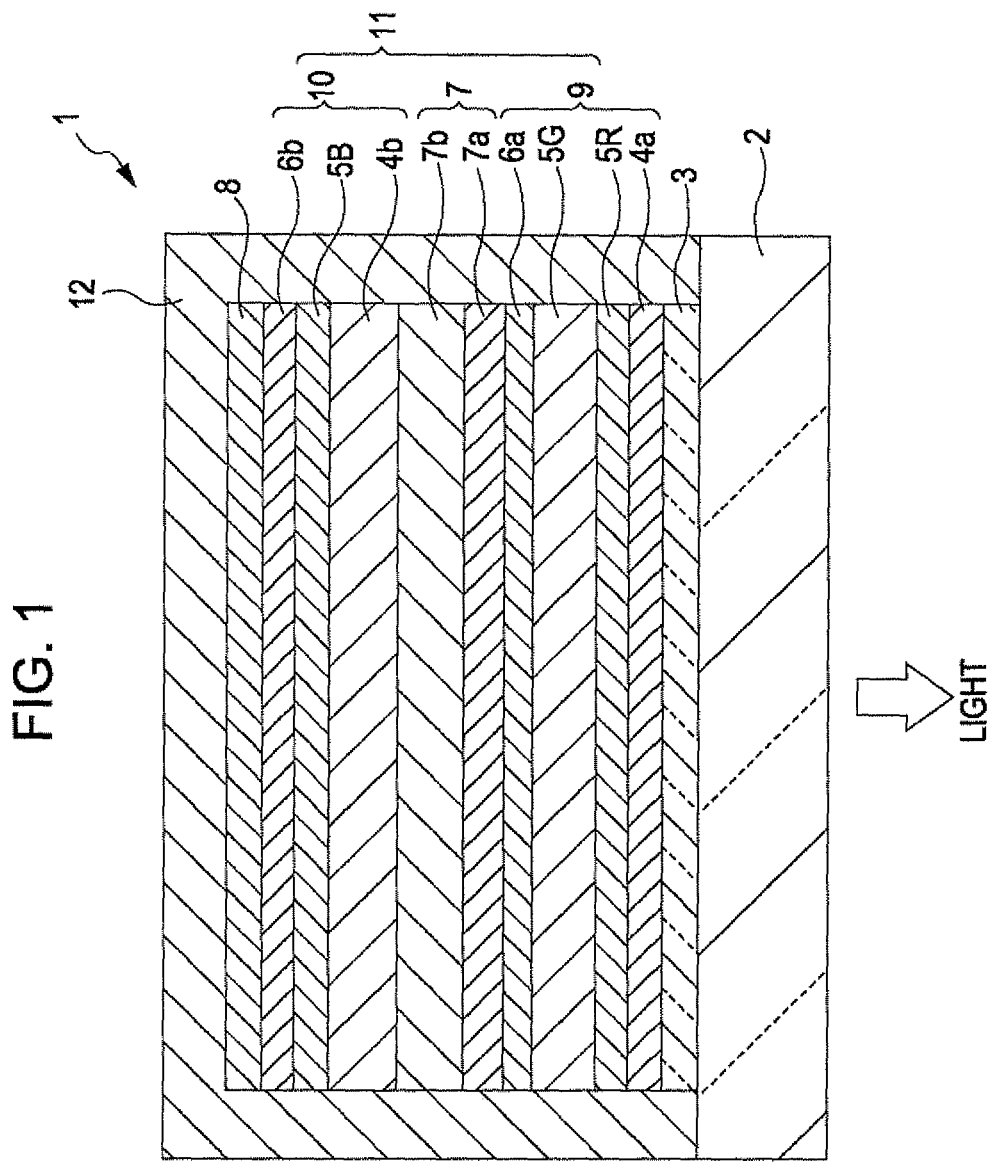
FIG. 1 schematically illustrates a longitudinal section of a light-emitting device according to an aspect of the invention.

FIG. 1 schematically illustrates a longitudinal section of a light-emitting device according to an embodiment of the invention. For convenience of illustration, the top of FIG. 1 is referred to as the "top" of the device, whereas the bottom of FIG. 1 is referred to as the "bottom" of the device.

A light-emitting device (EL device) 1 illustrated in FIG. 1 emits white light by combining red (R) light, green (G) light, and blue (B) light.

The light-emitting device 1 includes an anode 3 and a cathode 8 and further includes a first light-emitting unit 9, a carrier generation layer 7, and a second light-emitting unit 10 that are stacked in sequence between the anode 3 and the cathode 8.

In other words, the light-emitting device 1 has a laminate 11 that is disposed between the two electrodes, the laminate 11 including the first light-emitting unit 9, the carrier generation layer 7, and the second light-emitting unit 10 that are stacked in sequence.

In the embodiment, the first light-emitting unit 9 includes a laminate formed by stacking a hole transport layer 4a, a red light-emitting layer 5R, a green light-emitting layer 5G, and an electron transport layer 6a in sequence. The second light-emitting unit 10 includes a laminate formed by stacking a hole transport layer 4b, a blue light-emitting layer 5B, and an electron transport layer 6b in sequence. Namely, the light-emitting units 9 and 10 respectively include the laminates having at least one light-emitting layer, the hole transport layers 4a and 4b, and the electron transport layers 6a and 6b, the hole transport layers 4a and 4b being positioned at the side of the anode 3, and the electron transport layers 6a and 6b being positioned at the side of the cathode 8.

Furthermore, the carrier generation layer 7 includes a laminate formed by stacking an n-type electron transport layer 7a and an electron-withdrawing layer 7b in sequence.

The light-emitting device 1 is entirely provided on a substrate 2 and sealed by a sealing member 12.

In the light-emitting device 1, electrons are supplied (injected) from the cathode 8 to each of the red light-emitting layer 5R, the blue light-emitting layer 5B, and the green light-emitting layer 5G, and holes are supplied (injected) from the anode 3 to each of the light-emitting layers. In each of the light-emitting layers, the holes and the electrons recombine and thereby release energy, and excitons are generated by the released energy. Then, energy (fluorescence or phosphorescence) is released when the excitons return to a ground state. Accordingly, the red light-emitting layer 5R, the blue light-emitting layer 5B, and the green light-emitting layer 5G respectively emit red light, blue light, and green light. Consequently, the light-emitting device 1 emits white light.

Especially, in the light-emitting device 1 of the embodiment, holes and electrons are further generated in the carrier generation layer 7. The electrons are injected into each of the red light-emitting layer 5R and the green light-emitting layer 5G, and the holes are injected into the blue light-emitting layer 5B. Therefore, the light-emitting device 1 is capable of emitting light with high luminance, thereby providing the light-emitting device 1 having excellent light emission efficiency.

The substrate 2 supports the anode 3. The light-emitting device 1 of the embodiment has a configuration in which light is emitted from the side of the substrate 2 (bottom emission type). Therefore, the substrate 2 and the anode 3 are configured so as to be substantially transparent (colorless transparent, colored transparent, or semi-transparent).

Examples of a material of the substrate 2 include a resin material such as polyethylene terephthalate, polyethylene naphthalate, polypropylene, cycloolefin polymer, polyamide, polyether sulfone, polymethylmethacrylate, polycarbonate, or polyarylate; and a glass material such as quartz glass or soda glass. These materials may be used alone or in combination of two or more.

Although the average thickness of the substrate 2 is not specifically limited, the substrate 2 preferably has an average thickness that is approximately in the range from 0.1 to 30 mm and more preferably has an average thickness that is approximately in the range from 0.1 to 10 mm.

In cases where the light-emitting device 1 has a configuration in which light is emitted from the opposite side of the substrate 2 (top emission type), either a transparent or nontransparent substrate may be used.

Examples of the nontransparent substrate include a substrate made of a ceramic material such as alumina, a metallic substrate such as stainless steel on which an oxide film (insulating film) is formed on a surface thereof, and a substrate made of a resin material.

The light-emitting device 1 is formed on the substrate 2. Components of the light-emitting device 1 will be hereinafter described in series.

Anode 3

The anode 3 injects holes into the hole transport layer 4a included in the first light-emitting unit 9 that will be hereinafter described in detail.

Although a material of the anode 3 is not specifically limited, a material having a large work function and excellent electric conductivity is preferably used.

Examples of the material of the anode 3 include oxides such as indium tin oxide (ITO), indium zinc oxide (IZO), $In_2O_3$, $SnO_2$, Sb-containing $SnO_2$, and Al-containing ZnO; Au; Pt; Ag; Cu; and an alloy thereof. These materials may be used alone or in combination of two or more.

Although the average thickness of the anode 3 is not specifically limited, the anode 3 preferably has an average thickness that is approximately in the range from 10 to 200 nm and more preferably has an average thickness that is approximately in the range from 50 to 150 nm.

First Light-Emitting Unit 9

As described above, the first light-emitting unit (first light-emitting section) 9 includes the hole transport layer 4a, the red light-emitting layer 5R, the green light-emitting layer 5G, and the electron transport layer 6a, and each of the layers is stacked in sequence from the side of the anode 3 to the side of the cathode 8.

In the first light-emitting unit 9 having such a configuration, the red light-emitting layer 5R and the green light-emitting layer 5G receive holes that are supplied (injected) through the hole transport layer 4a and receive electrons that are supplied (injected) through the electron transport layer 6a. Then, in the red light-emitting layer 5R and the green light-emitting layer 5G, the holes and the electrons recombine and thereby release energy, and excitons are generated by the released energy. Energy (fluorescence or phosphorescence) is released when the excitons return to a ground state. Accordingly, the red light-emitting layer 5R and the green light-emitting layer 5G respectively emit red light and green light.

Hole Transport Layer 4a

The hole transport layer (first hole transport layer) 4a has a function of transporting the holes injected from the anode 3 to the red light-emitting layer 5R.

Examples of a material of the hole transport layer 4a include, but are not limited to, amine-based compounds such as N,N,N',N'-tetraphenylbenzidine and derivatives thereof. These materials may be used alone or in combination of two or more.

Although the average thickness of the hole transport layer 4a is not specifically limited, the hole transport layer 4a preferably has an average thickness that is approximately in the range from 10 to 150 nm and more preferably has an average thickness that is approximately in the range from 10 to 100 nm.

Red Light-Emitting Layer 5R

The red light-emitting layer 5R contains a red light-emitting material that emits red light.

The red light-emitting material receives holes that are supplied (injected) through the hole transport layer 4a and receives the electrons that are supplied (injected) through the electron transport layer 6a. Therefore, the holes and the electrons recombine and thereby release energy, and excitons are generated by the released energy. Energy (fluorescence or phosphorescence) is released as red light when the excitons return to a ground state.

Such a red light-emitting material is not specifically limited, and various types of red fluorescent materials and various types of red phosphorescent materials may be used alone or in combination of two or more.

The red fluorescent materials are not specifically limited as long as red fluorescence is emitted. Examples of the red fluorescent materials include perylene derivatives such as a compound (diindenoperylene derivative) represented by the formula 1, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM).

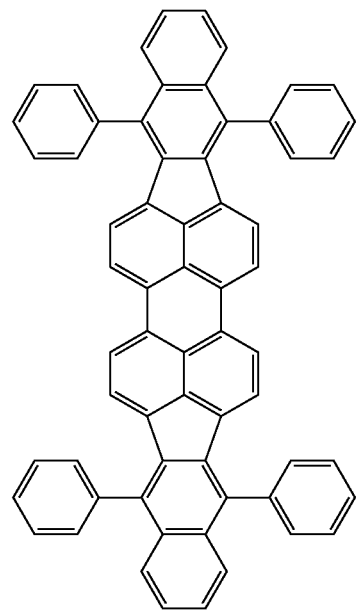

(1)

Especially, the diindenoperylene derivatives are preferably used as the red light-emitting material, so that the red light-emitting layer 5R is capable of emitting light with high luminance.

The red phosphorescent materials are not specifically limited as long as red phosphorescence is emitted. Examples of the red phosphorescent materials include metal complexes such as those of Ir, Ru, Pt, Os, Re, or Pd. In these metal complexes, at least one of their ligands may have; for example, a phenylpyridine backbone, a bipyridyl backbone, or a porphyrin backbone. Specific examples include tris(1-phenylisoquinoline)iridium, bis[2-(2'-benzo[4,5-α]thienyl)pyridinato-N,C$^{3'}$]iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinato-N,C$^{3'}$]iridium, and bis(2-phenylpyridine)iridium(acetylacetonate).

In addition to the red light-emitting material, the red light-emitting layer 5R may contain a host material that contains the red light-emitting material as a guest material.

The host material functions to excite the red light-emitting material by generating excitons through the recombination of electrons and holes and transferring the energy of the excitons to the red light-emitting material (Forster transfer or Dexter transfer). In cases where the host material is used, for example, the host material may be doped with the red light-emitting material as the guest material which serves as a dopant.

The host material is not specifically limited as long as the host material has the above effect on the red light-emitting material to be used. In cases where the red light-emitting material contains the red fluorescent material, examples of the host material include acene derivatives (acene-based material) such as naphthacene derivatives (for example, compounds represented by the formula 2), naphthalene derivatives, anthracene derivatives; distyrylarylene derivatives; perylene derivatives; distyrylbenzene derivatives; distyrylamine derivatives; quinolinolato metal complexes such as tris(8-quinolinolato) aluminum complexes (Alq$_3$); triarylamine derivatives such as triphenylamine tetramer; oxadiazole derivatives; silole derivatives; dicarbazole derivatives, oligothiophene derivatives; benzopyran derivatives, triazole derivatives; benzoxazole derivatives; benzothiazole derivatives; quinoline derivatives; and 4,4'-bis(2,2'-diphenylvinyl) biphenyl (DPVBi). These materials may be used alone or in combination of two or more.

(2)

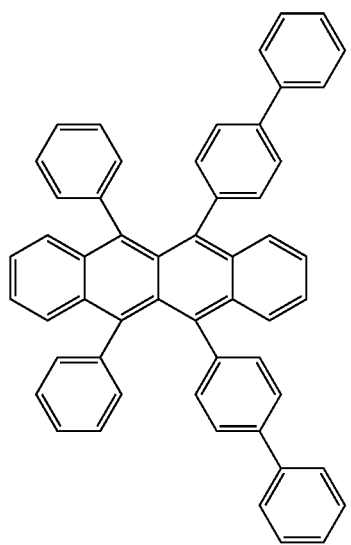

Among these materials, the acene derivatives (naphthalene derivatives, particularly) are preferably employed as the host material of the red light-emitting layer 5R. Especially, in cases where diindenoperylene derivatives are used as the red light-emitting material, the red light-emitting layer 5R containing the naphthalene derivatives is capable of emitting red light with high efficiency and high luminance.

In cases where the red light-emitting material contains a red phosphorescent material, examples of the host material include carbazole derivatives such as 3-phenyl-4-(1'-naphthyl)-5-phenylcarbazole and 4,4'-N,N'-dicarbazolebiphenyl (GBP). These materials may be used alone or in combination of two or more.

In cases where the host material is used in combination with the red light-emitting material (guest material), the amount (dosage) of the red light-emitting material contained in the red light-emitting layer 5R is preferably in the range from 0.01 to 10% by weight, more preferably in the range from 0.1 to 5% by weight. The content of the red light-emitting material is configured so as to fall within the above ranges, so that the light emission efficiency is capable of being optimized.

The red light-emitting layer 5R may contain a yellow light-emitting material as the light-emitting material in addition to the red light-emitting material. The yellow light-emitting material is contained, so that variety is capable of being added to a tone of the red light. An example of the yellow light-emitting material includes a yellow fluorescent material. Specifically, examples of such a material include compounds, such as rubrene materials, each having a naphthacene skeleton and produced by substituting the substituents of naphthalene with an aryl group (phenyl group, preferably) in appropriate sites and numbers (two to six, preferably) and includes mono-indenoperylene derivatives.

Although the average thickness of the red light-emitting layer 5R is not specifically limited, the red light-emitting layer 5R preferably has an average thickness that is approximately in the range from 10 to 150 nm and more preferably has an average thickness that is approximately in the range from 10 to 100 nm.

Because each of the red light-emitting materials described above has a relatively narrow bandgap, such a material easily traps electrons and holes and emits light. Accordingly, the red light-emitting layer 5R is disposed on the side of the anode 3, and the blue light-emitting layer 5B and the green light-emitting layer 5G, which have wider bandgaps and therefore less easily emit light, are disposed on the side of the cathode 8, so that each of the light-emitting layers is capable of emitting light in a balanced manner.

Green Light-Emitting Layer 5G

The green light-emitting layer 5G contains a green light-emitting material that emits green light.

The green light-emitting material receives the holes that are supplied (injected) through the hole transport layer 4a and receives the electrons that are supplied (injected) through the electron transport layer 6a. Therefore, the holes and the electrons recombine and thereby release energy, and excitons are generated by the released energy. Energy (fluorescence or phosphorescence) is released as green light when the excitons return to a ground state.

Such a green light-emitting material is not specifically limited, and examples of such a material include various types of green fluorescent materials and various types of green phosphorescent materials. These materials may be used alone or in combination of two or more.

The green fluorescent materials are not specifically limited as long as green fluorescence is emitted. Examples of the green fluorescent materials include coumarin derivatives; quinacridones, such as quinacridone derivatives represented by the formula 3, and derivatives thereof; 9,10-bis[(9-ethyl-3-carbazolyl)-vinylenyl]-anthracene; poly(9,9-dihexyl-2,7-vinylenefluorenylene); poly[(9,9-dioctylfluorene-2,7-diyl)-co-(1,4-diphenylene-vinylene-2-methoxy-5-{2-ethylhexyloxy}benzene)]; and poly[(9,9-dioctyl-2,7-divinylenefluorenylene)-alt-co-(2-methoxy-5-(2-ethoxyhexyloxy)-1,4-phenylene)].

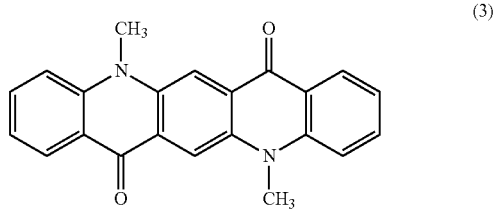 [SMILES: Cn1c2ccccc2c(=O)c2cc3c(cc21)c(=O)c1ccccc1n3C]

(3)

The green phosphorescent materials are not specifically limited as long as green phosphorescence is emitted. Examples of the green phosphorescent materials include metal complexes such as those of Ir, Ru, Pt, Os, Re, or Pd. Specific examples include fac-tris(2-phenylpyridine)iridium [Ir(ppy)$_3$], bis(2-phenylpyridinato-N,C$^{2'}$)iridium(acetylacetonate), and fac-tris[5-fluoro-2-(5-trifluoromethyl-2-pyridinyl)phenyl-C,N]iridium.

In addition to the green light-emitting material, the green light-emitting layer 5G may contain a host material that contains the green light-emitting material as a guest material.

Such a host material is capable of employing materials similar to examples of the host material of the red light-emitting material 5R.

Electron Transport Layer 6a

The electron transport layer (first electron transport layer) 6a has a function of transporting the electrons injected from the carrier generation layer 7 to the green light-emitting layer 5G.

Examples of a material (electron transporting material) of the electron transport layer 6a include, but are not limited to, quinoline derivatives [such as organometallic complexes, for example tris(8-quinolinolato)aluminum (Alq$_3$), having 8-quinolinol or a derivative thereof as a ligand], oxadiazole derivatives, perylene derivatives, pyridine derivatives, pyrimidine derivatives, quinoxaline derivatives, diphenylquinone derivatives, and nitro-substituted fluorene derivatives. These materials may be used alone or in combination of two or more.

The average thickness of the electron transport layer 6a is not limited, and the electron transport layer 6a preferably has an average thickness that is approximately in the range from 0.5 to 100 nm and more preferably has an average thickness that is approximately in the range from 1 to 50 nm. By virtue of such a configuration, the electrons injected from the carrier generation layer 7 are capable of being desirably transferred to the green light-emitting layer 5G, and action of holes that have passed through the green light-emitting layer 5G is capable of being desirably blocked.

The first light-emitting unit 9 having the configurations described above may include an appropriate layer other than the hole transport layer 4a and the electron transport layer 6a that are respectively provided so as to contact the red light-emitting layer 5R and the green light-emitting layer 5G. For example, a hole injection layer may be provided on the hole transport layer 4a so as to be positioned on the side of the anode 3, or an electron injection layer may be provided on the electron transport layer 6a so as to be positioned on the side of the carrier generation layer 7. Examples of the hole injection layer and electron injection layer include the following configurations.

Hole Injection Layer

The hole injection layer has a function of improving efficiency of injecting holes from the anode 3 into the hole transport layer 4a.

Examples of a material (hole-injecting material) of the hole injection layer include, but are not limited to, amine-based compounds such as N,N,N',N'-tetraphenyl-p-diaminobenzene and derivatives thereof. These materials may be used alone or in combination of two or more.

Although the average thickness of the hole injection layer is not specifically limited, the hole injection layer preferably has an average thickness that is approximately in the range from 5 to 150 nm and more preferably has an average thickness that is approximately in the range from 10 to 100 nm.

Electron Injection Layer

The electron injection layer has a function of improving efficiency of injecting electrons from the carrier generation layer 7 into the electron transport layer Ga.

Examples of a material of the electron injection layer (electron-injecting material) include various types of inorganic insulating materials and include various types of inorganic semiconductor materials.

Examples of such inorganic insulating materials include alkali metal chalcogenides (oxides, sulfides, selenides, tellurides), alkali earth metal chalcogenides, halides of alkali metals, and halides of alkali earth metals. These materials may be used alone or in combination of two or more.

Examples of the alkali metal chalcogenides include Li$_2$O, LiO, Na$_2$S, Na$_2$Se, and NaO.

Examples of the alkali earth metal chalcogenides include CaO, BaO, SrO, BeO, BaS, MgO, and CaSe.

Examples of the halides of alkali metals include CsF, LiF, NaF, KF, LiCl, KCl, and NaCl.

Examples of the halides of alkali earth metals include CaF$_2$, BaF$_2$, SrF$_2$, MgF$_2$, and BeF$_2$.

Examples of the inorganic semiconductor materials include oxides, nitrides, and oxynitrides each containing at least one element selected from Li, Na, Ba, Ca, Sr, Yb, Al, Ga, In, Cd, Mg, Si, Ta, Sb, and Zn. These materials may be used alone or in combination of two or more.

Although the average thickness of the electron injection layer is not specifically limited, the electron injection layer preferably has an average thickness that is approximately in the range from 0.1 to 1000 nm and more preferably has an average thickness that is approximately in the range from 0.2 to 100 nm and most preferably has an average thickness that is approximately in the range from 0.2 to 50 nm.

Carrier Generation Layer 7

In embodiments of the invention, the carrier generation layer 7 is provided between the first light-emitting unit 9 described above and the second light-emitting unit 10 described hereinafter so as to contact each of the units.

The carrier generation layer 7 has the n-type electron transport layer (first carrier generation layer) 7a provided on the side of the first light-emitting unit 9 and has the electron-withdrawing layer 7b provided on the side of the second light-emitting unit 10 so as to be bonded to the first carrier generation layer, the n-type electron transport layer 7a containing alkali metal oxide and an electron-transporting material having electron transport properties, and the electron-withdrawing layer 7b containing an organic cyanide having an aromatic ring.

A voltage is applied to the carrier generation layer 7, thereby generating carriers (holes and electrons). The electrons are injected into the first light-emitting unit 9, and the holes are injected into the second light-emitting unit 10. Accordingly, the light-emitting device 1 is capable of emitting light with high luminance, and therefore the light-emitting device 1 has excellent light emission efficiency.

Furthermore, the n-type electron transport layer 7a contains a mixed material of the alkali metal oxide and the electron-transporting material, and the electron-withdrawing layer 7b contains organic cyanide. Therefore, as compared with the case in which the carrier generation layer is made of metal oxide, a driving voltage is capable of being decreased during emission of light. In addition, contact of metal oxide with the organic materials contained in the first light-emitting unit 9 and the second light-emitting unit 10 is sufficiently suppressed or prevented, and therefore the lifetime of the light-emitting device 1 is sufficiently prolonged.

Electron-Withdrawing Layer 7b

In embodiments of the invention, the electron-withdrawing layer 7b contains organic cyanide having an aromatic ring (hereinafter referred to as "aromatic ring-containing organic cyanide").

The aromatic ring-containing organic cyanide has excellent electron-withdrawing properties. The aromatic ring-containing organic cyanide is capable of withdrawing electrons from the hole-transporting material that is contained in a contacting layer (the hole transport layer 4b in the embodiment). Accordingly, in cases where a voltage is not applied to the electron-withdrawing layer 7b, in the vicinity of an interface between the electron-withdrawing layer 7b and the hole transport layer 4b, electrons are generated in the electron-withdrawing layer 7b, and holes are generated in the hole transport layer 4b. In such a state, in cases where a driving voltage is applied between the anode 3 and the cathode 8, namely in cases where a voltage is applied to the electron-withdrawing layer 7b, the holes generated in the vicinity of the interface between the electron-withdrawing layer 7b and the hole transport layer 4b are transported on the basis of the driving voltage, and then the transport of the holes contributes to emission of light from the blue light-emitting layer 5B included in the second light-emitting unit 10. In addition, the electrons generated in the vicinity of the interference between the electron-withdrawing layer 7b and the hole transport layer 4b are transported on the basis of the driving voltage, and then the transport of the electrons contributes to emission of light from the red light-emitting layer 5R and green light-emitting layer 5G included in the first light-emitting unit 9.

The electron-withdrawing layer 7b continuously generates the holes and electrons in such a manner during the application of the driving voltage, and the holes contribute to emission of light from the blue light-emitting layer 5B, and the electrons contribute to emission of light from the red light-emitting layer 5R and green light-emitting layer 5G.

Furthermore, the aromatic ring-containing organic cyanide is an organic material, and therefore the hole-transporting material (organic material) contained in the hole transport layer 4b is capable of being sufficiently free from contact with metal oxide as compared with the case in which the carrier generation layer is made of the metal oxide. Accordingly, the quality of the hole-transporting material is certainly prevented from being deteriorated and degraded.

The aromatic-ring containing organic cyanide is a stable compound and is capable of being used to easily form the electron-withdrawing layer 7b by a vapor-phase deposition method such as deposition. Accordingly, such a compound is preferably used for manufacturing the light-emitting device 1, so that quality of the light-emitting device 1 to be manufactured becomes easily stabilized, and a yield of the light-emitting device 1 becomes increased.

Examples of the aromatic ring-containing organic cyanide include, but are not limited to, hexaazatriphenylene derivatives into which a cyano group is introduced, and especially the hexaazatriphenylene derivatives represented by the formula 4 are preferably used.

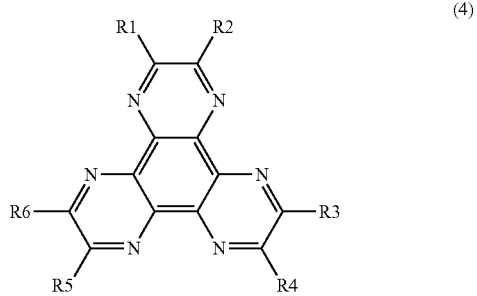

(4)

In the formula 4, R1 to R6 are each independently a cyano group (—CN), a sulfone group (—SO$_2$R'), a sulfoxide group (—SOR'), a sulfonamide group (—SO$_2$NR'$_2$), a sulfonate group (—SO$_3$R'), a nitro group (—NO$_2$), or a trifluoromethane group (—CF$_3$), and at least one substituent among R1 to R6 is a cyano group. R' represents an alkyl group, an aryl group, or a heterocyclic group each having 1 to 60 carbon atoms and unsubstituted or substituted with an amine group, an amide group, an ether group, or an ester group.

Such a compound has a function which is inherent in the aromatic ring-containing organic cyanide, namely has excellent electron-withdrawing properties, and therefore electrons are capable of being steadily withdrawn from an adjacent layer (hole transport layer 4b) and the withdrawn electrons are capable of being sufficiently transferred to the side of the n-type electron transport layer 7a (anode 3).

Furthermore, in the aromatic ring-containing organic cyanide as the compound represented by the formula 4, R1 to R6 are each preferably a cyano group. Namely, the aromatic ring-containing organic cyanide preferably employs hexacyanohexaazatriphenylene represented by the formula 5. The compound represented by the formula 5 has a plurality of cyano groups having high electron withdrawing properties, and therefore the advantageous function described above is efficiently provided.

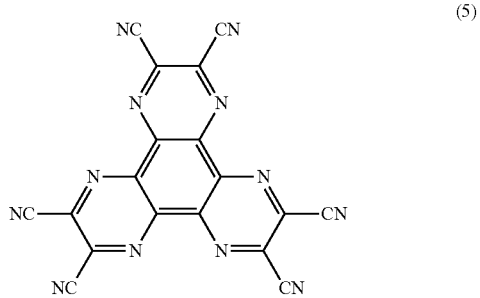 [SMILES: N#Cc1nc2c3nc(C#N)c(C#N)nc3c3nc(C#N)c(C#N)nc3c2nc1C#N]

(5)

Preferably, the aromatic ring-containing organic cyanide is contained in the electron-withdrawing layer 7b so as to be in an amorphous state. By virtue of such a configuration, the advantageous effect provided by the aromatic ring-containing organic cyanide is capable of being efficiently provided. In addition, the electron-withdrawing layer 7b is formed by the vapor-phase deposition method such as vacuum vapor deposition, so that the aromatic ring-containing organic cyanide is capable of being made to be in an amorphous state.

Although the average thickness of the electron-withdrawing layer 7b is not specifically limited, the electron-withdrawing layer 7b preferably has an average thickness that is approximately in the range from 5 to 40 nm and more preferably has an average thickness that is approximately in the range from 10 to 30 nm. By virtue of such a configuration, increase of a driving voltage of the light-emitting device 1 is capable of being prevented, and the advantageous function of the electron-withdrawing layer 7b is capable of being sufficiently provided.

N-Type Electron Transport Layer 7a

In embodiments of the invention, the n-type electron transport layer (first carrier generation layer) 7a contains alkali metal oxide and an electron-transporting material having electron transport properties.

In the n-type electron transport layer 7a having such compositions, the alkali metal oxide has a function of efficiently withdrawing the electrons toward the n-type electron transport layer 7a, the electrons being generated in the electron-withdrawing layer 7b. The electron-transporting material has a function of efficiently transporting the electrons, which have been withdrawn from the electron-withdrawing layer 7b, through the n-type electron transport layer 7a and has a function of injecting the electrons into an adjacent layer (the electron transport layer 6a included in the first light-emitting unit 9 in the embodiment).

Accordingly, the n-type electron transport layer 7a provides a function of withdrawing the electrons generated in the electron-withdrawing layer 7b toward the n-type electron transport layer 7a and has a function of transporting the electrons through the n-type electron transport layer 7a to finally inject the electrons into the adjacent layer in an efficient manner.

Furthermore, the n-type electron transport layer 7a having such a configuration contains a mixed material of the alkali metal oxide and electron-transporting material, namely contains a mixed material of the metal oxide and an organic material. Therefore, as compared with the case in which the carrier generation layer is made of the metal oxide, the electron-transporting material (organic material) contained in the electron transport layer 6a is capable of being sufficiently free from contact with the metal oxide. Accordingly, the quality of the electron-transporting material is sufficiently prevented from being degraded and deteriorated.

Examples of the alkali metal oxide include, but are not limited to, lithium oxide ($Li_2O$), sodium oxide ($Na_2O$), and potassium oxide ($K_2O$), and these oxides may be used alone or in combination two or more. Especially, the lithium oxide ($Li_2O$) is preferably used among these oxides. Li has a low work function especially in alkali metals, and therefore the oxide of such a metal provides a function of further efficiently withdrawing the electrons generated in the electron-withdrawing layer 7b toward the n-type electron transport layer 7a. In addition, the lithium oxide is one type of oxide and therefore has a stable status in air, so that the material is easily changed in the film formation apparatus.

Examples of the electron-transporting material include, but are not limited to, quinoline derivatives [such as organometallic complexes, for example tris(8-quinolinolato)aluminum ($Alq_3$), having 8-quinolinol or a derivative thereof as a ligand], oxadiazole derivatives, perylene derivatives, pyridine derivatives, pyrimidine derivatives, quinoxaline derivatives, diphenylquinone derivatives, and nitro-substituted fluorene derivatives. These materials may be used alone or in combination of two or more.

Preferably, such an electron-transporting material is similar or identical to the electron-transporting material contained in the electron transport layer 6a included in the first light-emitting unit 9. By virtue of such a configuration, the electrons are capable of being further efficiently injected from the n-type electron transport layer 7a into the adjacent electron transport layer 6a.

In the n-type electron transport layer 7a, although a content ratio (volume ratio) of the alkali metal oxide is not specifically limited, the content ratio is preferably in the approximate range from 0.4% to 14% and is more preferably in the approximate range from 2% to 5%. Accordingly, the electrons generated in the electron-withdrawing layer 7b are capable of being further efficiently withdrawn toward the n-type electron transport layer 7a, and deactivation of the excitons generated in the light-emitting layers 5G and 5R is capable of being suppressed. Therefore, excellent light-emitting properties are capable of being provided.

Preferably, the alkali metal oxide is contained in the n-type electron transport layer 7a so as to be distributed entirely on the side of the electron-withdrawing layer 7b. Namely, a content ratio of the alkali metal oxide is preferably decreased from the side of the electron-withdrawing layer 7b to the side of the anode 3. Accordingly, the electrons generated in the electron-withdrawing layer 7b is capable of being efficiently withdrawn toward the n-type electron transport layer 7a, and the electrons are capable of being transported through the n-type electron transport layer 7a and are capable of being finally injected into an adjacent layer in a further efficient manner.

The n-type electron transport layer 7a preferably has an average thickness that is approximately in the range from 5 to 60 nm and more preferably has an average thickness that is approximately in the range from 10 to 30 nm. By virtue of such a configuration, the increase of a driving voltage of the light-emitting device 1 is capable of being prevented, and the n-type electron transport layer 7a is capable of sufficiently functioning.

Second Light-Emitting Unit 10

As described above, the second light-emitting unit (second light-emitting section) 10 includes the hole transport layer 4b, the blue light-emitting layer 5B, and the electron transport layer 6b, each layer being stacked in sequence from the side of the anode 3 to the side of the cathode 8.

In the second light-emitting unit 10 having such a configuration, the blue light-emitting layer 5B receives holes that are supplied (injected) through the hole transport layer 4b and receives electrons that are supplied (injected) through the electron transport layer 6b. Then, in the blue light-emitting layer 5B, the holes and the electrons recombine and thereby release energy, and excitons are generated by the released energy. Energy (fluorescence or phosphorescence) is released when the excitons return to a ground state. Accordingly, the blue light-emitting layer 5B emits blue light.

Hole Transport Layer 4b

The hole transport layer (second hole transport layer) 4b has a function of transporting the holes injected from the carrier generation layer 7 to the blue light-emitting layer 5B.

Although a material of the hole transport layer 4b is not specifically limited, the material the same as that of the hole transport layer 4a included in the first light-emitting unit 9 is capable of being used.

Although the average thickness of the hole transport layer 4b is not specifically limited, the hole transport layer 4b preferably has an average thickness that is approximately in the range from 10 to 150 nm and more preferably has an average thickness that is approximately in the range from 10 to 100 nm. By virtue of such a configuration, the holes are capable of being desirably transported to the blue light-emitting layer 5B.

Blue Light-Emitting Layer 5B

The blue light-emitting layer 5B contains a blue light-emitting material that emits blue light.

The blue light-emitting material receives the holes supplied (injected) through the hole transport layer 4b and receives the electrons supplied (injected) through the electron transport layer 6b. Therefore, the holes and the electrons recombine and thereby release energy, and excitons are generated by the released energy. Energy (fluorescence or phosphorescence) is released as blue light when the excitons return to a ground state.

Examples of such a blue light-emitting material include various types of blue fluorescent materials and various types of blue phosphorescent materials, and these materials may be used alone or in combination of two or more.

The blue fluorescent materials are not specifically limited as long as blue fluorescence is emitted. Examples of the blue fluorescent materials include distyrylamine derivatives such as distyryldiamine compounds represented by the formula 6, fluoranthene derivatives, pyrene derivatives, perylene and derivatives thereof, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis (9-ethyl-3-carbazovinylene)-1,1'-biphenyl(BCzVBi), poly [(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)].

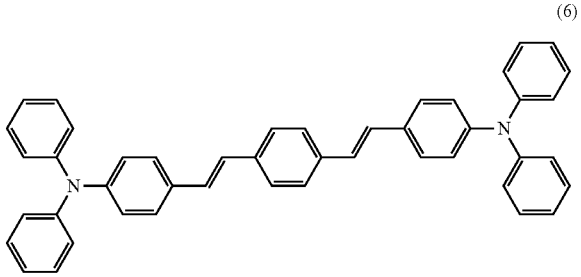 [SMILES: C(=C\c1ccc(N(c2ccccc2)c2ccccc2)cc1)/c1ccc(/C=C/c2ccc(N(c3ccccc3)c3ccccc3)cc2)cc1]

(6)

The blue phosphorescent materials are not specifically limited as long as blue phosphorescence is emitted. Examples of the blue phosphorescent materials include metal complexes such as those of Ir, Ru, Pt, Os, Re, and Pd. Specific examples include bis[4,6-difluorophenylpyridinato-N,$C^{2'}$]-picolinate-iridium, tris[2-(2,4-difluorophenyl)pyridinato-N,$C^{2'}$]iridium, bis[2-(3,5-trifluoromethyl)pyridinato-N,$C^{2'}$]-picolinate-iridium, and bis(4,6-difluorophenylpyridinato-N,$C^{2'}$) iridium(acetylacetonate).

In addition to the blue light-emitting material, the blue light-emitting layer 5B may contain a host material that contains the blue light-emitting material as a guest material.

Such a host material is capable of employing materials similar to examples of the host material of the red light-emitting material 5R.

Electron Transport Layer 6b

The electron transport layer (second electron transport layer) 6b has a function of transporting the electrons to the blue light-emitting layer 5B, the electrons being injected from the cathode 8.

Although a material of the electron transport layer 6b is not specifically limited, such a material may employ the material the same as that of the electron transport layer 6a included in the first light-emitting unit 9.

Although the average thickness of the electron transport layer 6b is not specifically limited, the electron transport layer 6b preferably has an average thickness that is in the range from 0.5 to 100 nm and more preferably has an average thickness that is in the range from 1 to 50 nm. By virtue of such a configuration, the electrons are capable of being desirably transported to the blue light-emitting layer 5B.

The second light-emitting unit 10 having the configurations described above may include an appropriate layer other than the hole transport layer 4b and electron transport layer 6b that are provided so as to contact the blue light-emitting layer 5B. For example, a hole injection layer may be provided on the hole transport layer 4b so as to be positioned on the side of the carrier generation layer 7, or an electron injection layer may be provided on the electron transport layer 6b so as to be positioned on the side of the cathode 8. Examples of the hole injection layer and electron injection layer include the layers the same as those described with respect to the first light-emitting unit 9.

Cathode 8

The cathode 8 injects electrons into the electron transport layer 6b. A material of the cathode 8 preferably employs a material having a low work function.

Examples of the material of the cathode 8 include Li, Mg, Ca, Sr, La, Ce, Er, Eu, Sc, Y, Yb, Ag, Cu, Al, Cs, Rb, and an alloy thereof. These materials may be used alone or in combination of two or more (for example, laminate including several layers).

Especially, in cases where the alloy is used as the material of the cathode 8, an alloy containing a stable metal element such as Ag, Al, or Cu, specifically an alloy such as MgAg, AlLi, or CuLi, is preferably used. Such an alloy is used as the material of the cathode 8, so that the efficiency and stability of electron injection are capable of being improved in the cathode 8.

Although the average thickness of the cathode 8 is not specifically limited, the cathode 8 preferably has an average thickness that is approximately in the range from 100 to 10000 nm and more preferably has an average thickness that is approximately in the range from 200 to 500 nm.

The light-emitting device 1 of the embodiment is a bottom emission type, and therefore the cathode 8 may not have specific optical transparency.

Sealing Member 12

The sealing member 12 is provided so as to cover the anode 3, the laminate 11, and the cathode 8 and has a function of sealing each component to provide air proof, thereby blocking oxygen and moisture. The sealing member 12 is provided, thereby obtaining advantageous effect, for example, that the light-emitting device 1 obtains improved reliability and that the quality of the light-emitting device 1 is prevented from being degraded and deteriorated (durability is provided).

Examples of a material of the sealing member 12 include Al, Au, Cr, Nb, Ta, Ti, or an alloy thereof; silicon oxide; and various resin materials. In cases where an electrically conductive material is used as the material of the sealing member 12, an insulating film is preferably provided between the sealing member 12 and the components including the anode 3, laminate 11, and cathode 8 where appropriate in order to prevent short circuit.

Furthermore, in order to obtain sealing, the sealing member 12 may be provided in the form of a plate so as to face the substrate 2, and a sealing material such as a thermosetting resin may be provided therebetween.

In the light-emitting device 1 having such a configuration, each of the red light-emitting layer 5R, the blue light-emitting layer 5B, and the green light-emitting layer 5G receives the electrons supplied (injected) from the cathode 8 and receives the holes supplied (injected) from the anode 3. Then, in each of the light-emitting layers, the holes and the electrons recombine and thereby release energy, and excitons are generated by the released energy. Energy (fluorescence or phosphorescence) is released when the excitons return to a ground state. Therefore, the red light-emitting layer 5R, the blue light-emitting layer 5B, and the green light-emitting layer 5G respectively emit red light, blue light, and green light. Accordingly, the light-emitting device 1 emits white light.

Especially, in the light-emitting device 1 of the embodiment, holes and electrons are generated in the carrier generation layer 7, and the electrons are injected into the red light-emitting layer 5R and the green light-emitting layer 5G, and the holes are injected into the blue light-emitting layer 5B. Therefore, the light-emitting device 1 is capable of emitting light with high luminance, so that the light-emitting device 1 having excellent light emission efficiency is capable of being provided.

Furthermore, the n-type electron transport layer 7a contains the mixed material of the alkali metal oxide and electron-transporting material, and the electron-withdrawing layer 7b contains the organic cyanide. Therefore, direct contact of the metal oxide with the organic materials contained in the first light-emitting unit 9 and the second light-emitting unit 10 is capable of being sufficiently suppressed or prevented as compared with the case in which the carrier generation layer is made of metal oxide, so that the lifetime of the light-emitting device 1 is sufficiently prolonged.

The embodiment has been described, in which the first light-emitting unit 9 includes the red light-emitting layer 5R and the green light-emitting layer 5G and in which the second light-emitting unit 10 includes the blue light-emitting layer 5B. However, embodiments are not limited to such a configuration. Each of the light-emitting units 9 and 10 may include at least one light-emitting layer. For example, the second light-emitting unit 10 may include the red light-emitting layer 5R and the green light-emitting layer 5G, and the first light-emitting unit 9 may include the blue light-emitting layer 5B. Furthermore, each of the first light-emitting unit 9 and the second light-emitting unit 10 may include the red light-emitting layer 5R, the blue light-emitting layer 5B, and the green light-emitting layer 5G. Moreover, for example, in cases where the light-emitting device 1 is a red light-emitting device that emits red light, each of the first light-emitting unit 9 and the second light-emitting unit 10 may include the red light-emitting layer 5R.

Method of Manufacturing Light-Emitting Device

For example, the light-emitting device 1 described above is capable of being manufactured through the following processes.

First Process

First, the substrate 2 is prepared, and then the anode 3 is formed on the substrate 2.

For example, the anode 3 is capable of being formed by a chemical vapor deposition (CVD) method such as plasma CVD or thermal CVD, a dry plating technique such as vacuum deposition, a wet plating technique such as electrolytic plating, a thermal spraying technique, a sol-gel method, a metal organic deposition (MOD) method, or a bonding technique utilizing metal foil.

Second Process

Subsequently, the hole transport layer 4a is formed on the anode 3.

For example, the hole transport layer 4a is capable of being formed by a gas phase process utilizing a CVD method or a dry plating technique such as vacuum deposition or spattering.

Furthermore, for example, a material for forming a hole transport layer is prepared by dissolving a hole-transporting material in a solvent or dispersing the hole-transporting material in a dispersion medium. Subsequently, the resultant material is applied onto the anode 3 and then is dried (removing the solvent or dispersing medium), thereby also being able to form the hole transport layer 4a.

The material for forming the hole transport layer is capable of being applied, for example, by various types of coating techniques such as a spin coating method, a roll coating technique, and an ink jet printing technique. Such coating techniques are used, thereby relatively easily forming the hole transport layer 4a.

Examples of the solvent or dispersion medium used for preparing the material for forming the hole transport layer include various types of inorganic solvents, various types of organic solvents, and a mixed solvent containing these solvents.

The drying is performed, for example, by leaving the product in air pressure or reduced-pressure atmosphere, thermal processing, or inert gas blasting.

Prior to this process, the upper surface of the anode 3 may be subjected to oxygen plasma processing. Such processing is capable of imparting a lyophilic property to the upper surface of the anode 3 and is capable of removing (cleaning) organic substances that adhere to the upper surface of the anode 3 and is capable of adjusting a work function around the upper surface of the anode 3.

Preferably, examples of the conditions of the oxygen plasma processing include plasma power that is approximately in the range from 100 to 800 W, a gas flow ratio that is approximately in the range from 50 to 100 mL/min, a work piece (anode 3) transportation speed that is approximately in the range from 0.5 to 10 mm/sec, and the temperature of the substrate 2 that is in the range from 70 to 90° C.

Third Process

Subsequently, the red light-emitting layer 5R is formed on the hole transport layer 4a.

For example, the red light-emitting layer 5R is capable of being formed by a gas phase process utilizing a CVD method or a dry plating technique such as vacuum deposition or spattering.

Fourth Process

Subsequently, the green light-emitting layer 5G is formed on the red light-emitting layer 5R.

For example, the green light-emitting layer 5G is capable of being formed by a gas phase process utilizing a CVD method or a dry plating technique such as vacuum deposition or spattering.

Fifth Process

Subsequently, the electron transport layer Ga is formed on the green light-emitting layer 5G.

For example, the electron transport layer 6a is capable of being formed by a gas phase process utilizing a CVD method or a dry plating technique such as vacuum deposition or spattering.

Furthermore, for example, a material for forming an electron transport layer is prepared by dissolving an electron-transporting material in a solvent or dispersing the electron-transporting material in a dispersion medium. Subsequently, the resultant material is applied onto the green light-emitting layer 5G and then is dried (removing the solvent or dispersing medium), thereby also being able to form the electron transport layer 6a.

Through the second to fifth processes, the first light-emitting unit 9 is formed on the anode 3.

Sixth Process

Subsequently, the n-type electron transport layer 7a is formed on the electron transport layer 6a.

For example, the n-type electron transport layer 7a is capable of being formed by a gas phase process utilizing a CVD method or a dry plating technique such as vacuum deposition or spattering.

Furthermore, for example, a material for forming an n-type electron transport layer is prepared by dissolving the material of the n-type electron transport layer 7a in a solvent or dispersing the material in a dispersion medium. Subsequently, the resultant material is applied onto the electron transport layer 6a and then is dried (removing the solvent or dispersing medium), thereby also being able to form the n-type electron transport layer 7a.

Seventh Process

Subsequently, the electron-withdrawing layer 7b is formed on the n-type electron transport layer 7a.

For example, the electron-withdrawing layer 7b is capable of being formed by a gas phase process utilizing a CVD method or a dry plating technique such as vacuum deposition or spattering.

Furthermore, for example, a material for forming an electron-withdrawing layer is prepared by dissolving the material of the electron-withdrawing layer 7b in a solvent or dispersing the material in a dispersion medium. Subsequently, the resultant material is applied onto the re-type electron transport layer 7a and then is dried (removing the solvent or dispersing medium), thereby also being able to form the electron-withdrawing layer 7b.

Through the sixth and seventh processes, the carrier generation layer 7 is formed on the first light-emitting unit 9.

Eighth Process

Subsequently, the hole transport layer 4b is formed on the electron-withdrawing layer 7b.

The hole transport layer 4b is capable of being formed in the manner the same as that employed for forming the hole transport layer 4a in the second process.

Ninth Process

Subsequently, the blue light-emitting layer 5B is formed on the hole transport layer 4b.

For example, the blue light-emitting layer 5B is capable of being formed by a gas phase process utilizing a CVD method or a dry plating technique such as vacuum deposition or spattering.

Tenth Process

Subsequently, the electron transport layer 6b is formed on the blue light-emitting layer 5B.

The electron transport layer 6b is capable of being formed in the manner the same as that employed for forming the electron transport layer 6a in the fifth process.

Through the eighth to tenth processes, the second light-emitting unit 10 is formed on the carrier generation layer 7.

Eleventh Process

Subsequently, the cathode 8 is formed on the electron transport layer 6b.

For example, the cathode 8 is capable of being formed by vacuum deposition, a spattering technique, a bonding technique utilizing metal foil, or applying ink of metal particles and then heating the applied ink.

Through these processes, the light-emitting device 1 is capable of being produced.

Finally, the sealing member 12 is provided so as to cover the produced light-emitting device 1 and then is bonded to the substrate 2.

The light-emitting device 1 described above is capable of being used as, for example, a light source. Furthermore, a plurality of the light-emitting devices 1 are arranged in the manner of a matrix, so that a configuration of a display (display device according to an aspect of the invention) is capable of being provided.

A driving system of the display is not specifically limited, and either an active matrix system or a passive matrix system may be appropriately employed.

Display Device

An example of a display to which a display device according to an embodiment of the invention is applied will be hereinafter described.

Figure 2:
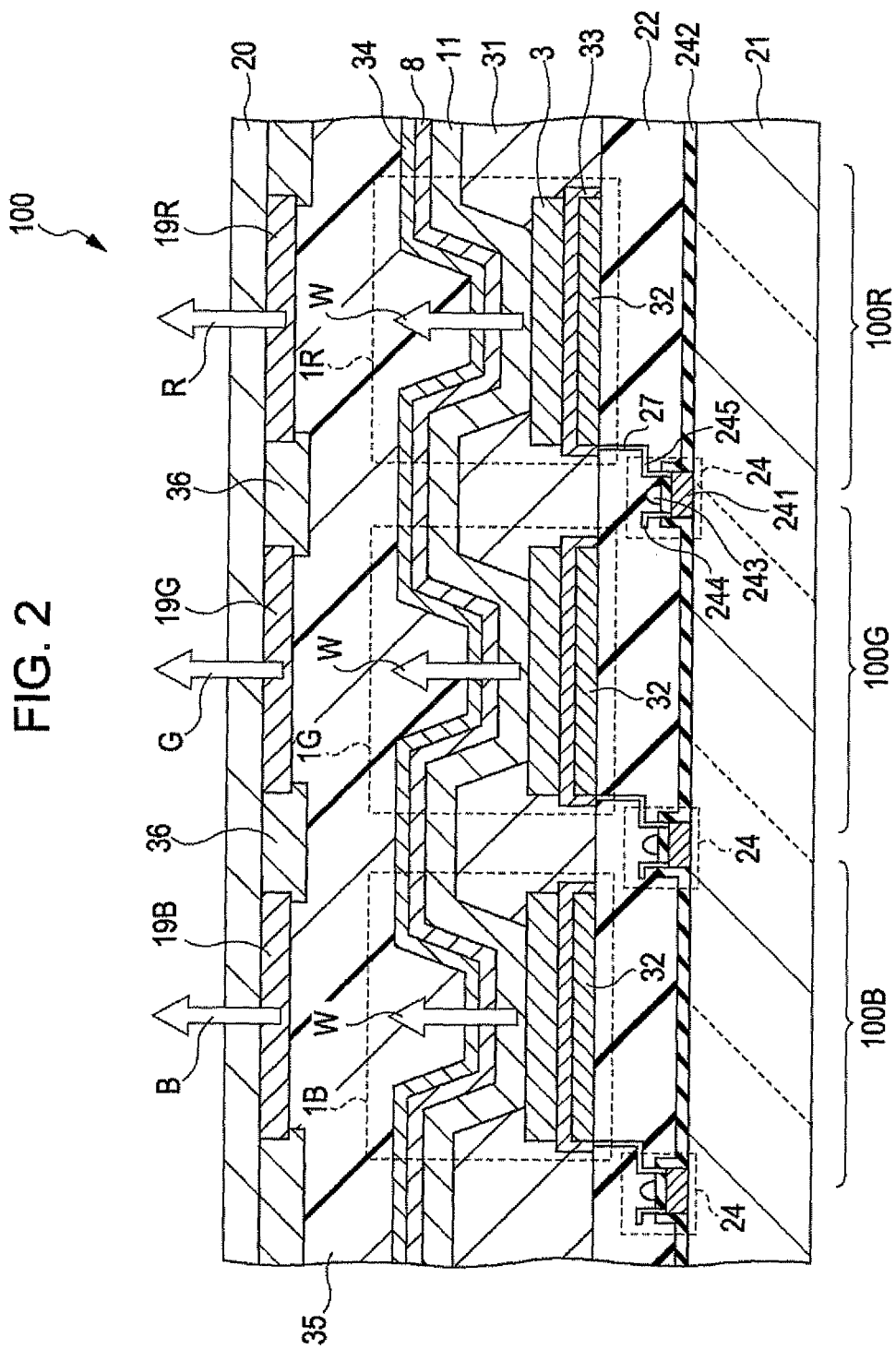
FIG. 2 is a longitudinal sectional view illustrating a display as an example of a display device according to an embodiment of the invention.

FIG. 2 is a longitudinal sectional view illustrating a display as an example of the display device according town embodiment of the invention.

A display 100 illustrated in FIG. 2 includes a substrate 21; a plurality of light-emitting devices 1R, 1G, and 1B that are respectively provided so as to correspond to subpixels 100R, 100G, and 100B; color filters 19R, 19G, and 19B; a plurality of driving transistors 24 that individually drives the light-emitting devices 1R, 1G, and 1B. The display 100 is a display panel having a top emission configuration.

The plurality of the driving transistors 24 are provided on the substrate 21. A planarizing layer 22 containing an insulating material is formed so as to cover the driving transistors 24.

Each of the driving transistors 24 includes a semiconductor layer 241 made of silicon, a gate insulating layer 242 formed on the semiconductor layer 241, a gate electrode 243 formed on the gate insulating layer 242, a source electrode 244, and a drain electrode 245.

The light-emitting devices 1R, 1G, and 1B are provided on the planarizing layer 22 so as to correspond to the individual driving transistors 24.

The light-emitting device 1R includes a reflective film 32, an anticorrosive film 33, the anode 3, the laminate (organic EL portion) 11, the cathode 8, a cathode cover 34 that are stacked on the planarizing layer 22 in sequence. In the embodiment, the anode 3 of each of the light-emitting devices 1R, 1G, and 1B configures a pixel electrode and is electrically connected to a drain electrode 245 of each of the driving transistors 24 through a conductor portion (wiring line) 27. The cathode 8 of each of the light-emitting devices 1R, 1G, and 1B configures a common electrode.

Each of the light-emitting devices 1G and 1B has a configuration the same as that of the light-emitting device 1R. In FIG. 2, components the same as those illustrated in FIG. 1 are denoted by the same symbols. The configurations (characteristics) of individual reflective films 32 of the light-emitting devices 1R, 1G, and 1B may be different from each other depending on the wavelength of light.

Separating walls 31 are provided between any two of the adjacent light-emitting devices 1R, 1G, and 1B. An epoxy layer 35 made of an epoxy resin is formed so as to cover the light-emitting devices 1R, 1G, and 1B.

The color filters 19R, 19G, and 19B are provided on the epoxy resin layer 35 so as to correspond to the light-emitting devices 1R, 1G, and 1B, respectively.

The color filter 19R converts white light W emitted from the light-emitting device 1R into red light. The color filter 19G converts white light W emitted from the light-emitting device 1G into green light. The color filter 19B converts white light W emitted from the light-emitting device 1B into blue light. The color filters 19R, 19G, and 19B are used in combination with the respective light-emitting devices 1R, 1G, and 1B, thereby being able to display a full-color image.

Light-shielding layers 36 are formed between any two of the adjacent color filters 19R, 19G, and 19B. The light-shielding layers 36 are capable of blocking unwanted light emitted from the subpixels 100R, 100G, and 100B.

A sealing substrate 20 overlies the color filters 19R, 19G, and 19B and the light shielding layers 36 so as to cover these components.

The display 100 described above may be configured as a monochrome display or as a color display that is provided by selecting a light-emitting material used for each of the light-emitting devices 1R, 1G, and 1B.

The display 100 (display device according to an aspect of the invention) is capable of being incorporated in various electronic apparatus.

Figure 3:
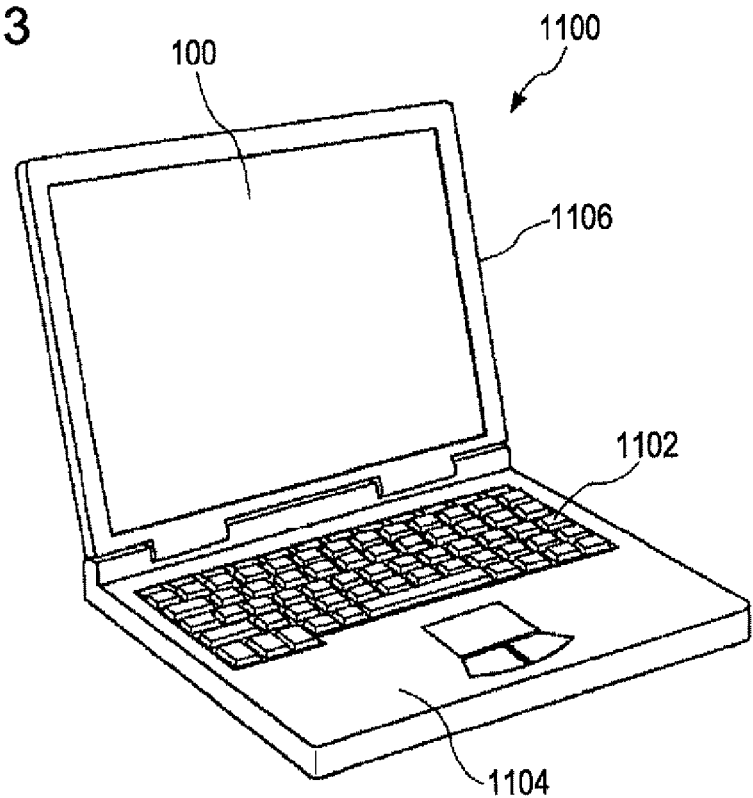
FIG. 3 is a perspective view illustrating the configuration of a mobile (or notebook) personal computer as an example of an electronic apparatus according to an embodiment of the invention.

FIG. 3 is a perspective view illustrating the configuration of a mobile (notebook) personal computer as an example of an electronic apparatus according to an embodiment of the invention.

In FIG. 3, a personal computer 1100 includes a main body 1104 having a keyboard 1102 and includes a display unit 1106 having a display section. The display unit 1106 is supported so as to be able to rotate around a hinge structure with respect to the main body 1104.

In the personal computer 1100, the display section of the display unit 1106 includes the display 100 described above.

Figure 4:
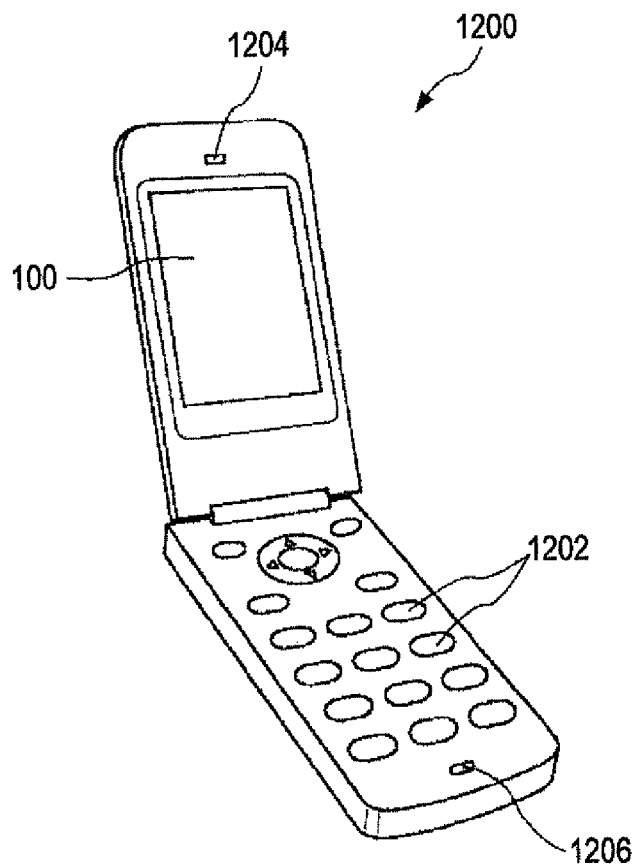
FIG. 4 is a perspective view illustrating the configuration of a mobile phone [also including a Personal Handyphone System (PHS)] as an example of the electronic apparatus according to an embodiment of the invention.

FIG. 4 is a perspective view illustrating the configuration of a mobile phone (including a PHS) as an example of the electronic apparatus according to an embodiment of the invention.

In FIG. 4, the mobile phone 1200 includes a plurality of operating buttons 1202, an earpiece 1204, a mouthpiece 1206, and a display section.

In the mobile phone 1200, the display section includes the display 100.

Figure 5:
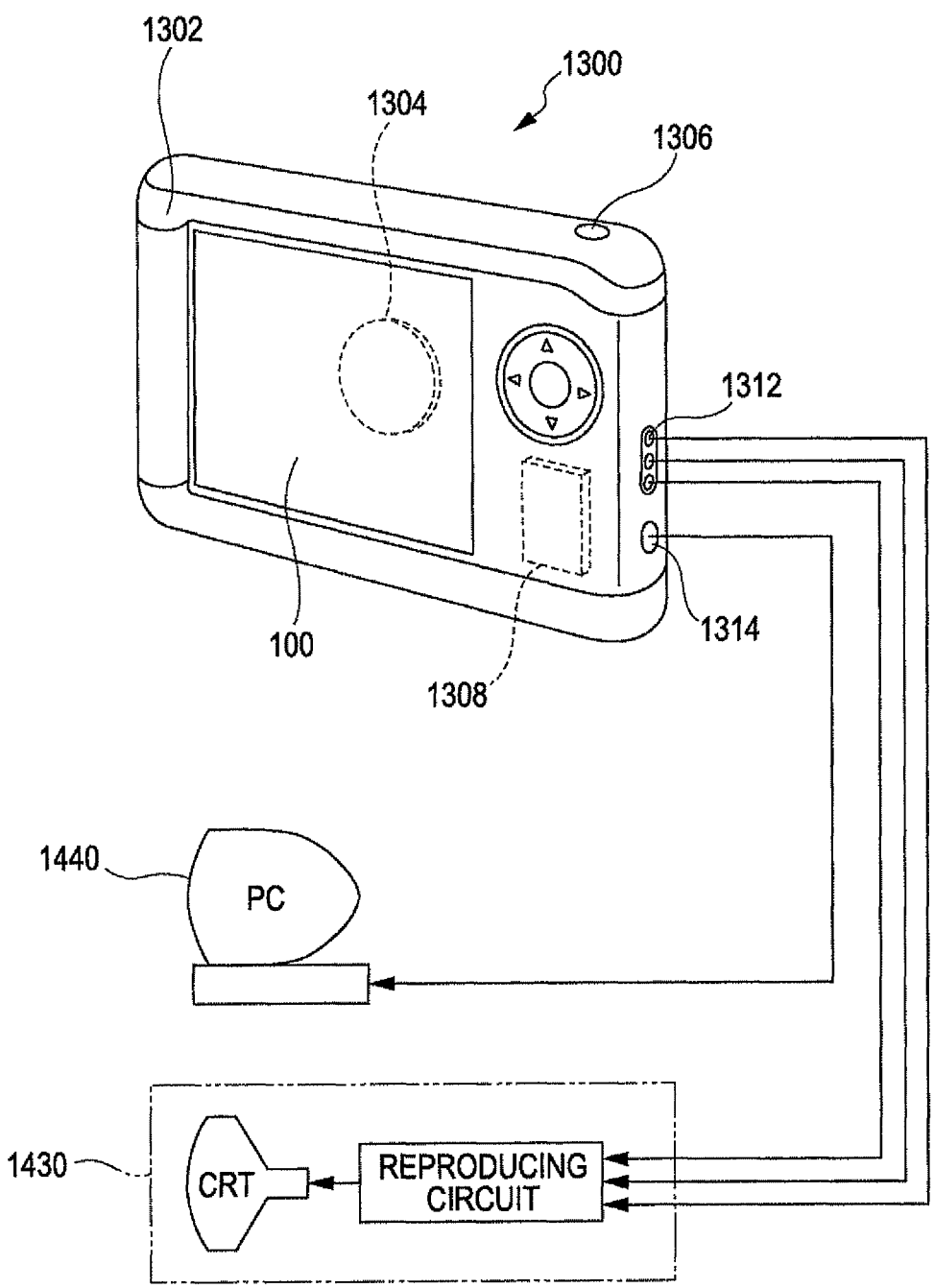
FIG. 5 is a perspective view illustrating the configuration of a digital still camera as an example of the electronic apparatus according to an embodiment of the invention.

FIG. 5 is a perspective view illustrating the configuration of a digital still camera as an example of the electronic apparatus according to an embodiment of the invention. FIG. 5 further illustrates connection to external apparatuses in a brief manner.

While a normal camera exposes a silver-salt photographic film to an optical image of a subject, a digital still camera 1300 photoelectrically converts an, optical image of a subject into imaging signals (picture signals) through an imaging device such as a charge-coupled device (CCD).

In the digital still camera 1300, a display section is provided on the back surface of a case (body) 1302. The display section displays an image on the basis of the imaging signals generated by the CCD. The display section functions as a viewfinder that displays a subject as a digital image.

In the digital still camera 1300, the display section includes the display 100.

The circuit board 1308 is provided inside the case. The circuit board 1308 has a memory device in which the imaging signals are capable of being stored (memorized).

A light-receiving unit 1304 is provided on the front surface (back side in FIG. 5) of the case 1302, the light-receiving unit 1304 including an optical lens (imaging optical system) and the CCD.

In cases where users press a shutter button 1306 while seeing a subject image displayed on the display section, the imaging signals generated by the CCD at that time are transmitted to and stored in the memory device of the circuit board 1308.

In the digital still camera 1300, video-signal output terminals 1312 and a data-communication input/output terminal 1314 are provided on the side of the case 1302. With reference to FIG. 5, the video-signal output terminals 1312 are appropriately connected to a monitor 1430, and the data-communication input/output terminal 1314 is appropriately connected to a personal computer 1440. The imaging signals stored in the memory device of the circuit board 1308 are capable of being output to the monitor 1430 and the personal computer 1440 with a predetermined manipulation.

In addition to the personal computer (mobile personal computer) of FIG. 3, the mobile phone of FIG. 4, and the digital still camera of FIG. 5, the electronic apparatus according to an embodiment of the invention is capable of being applied to, for example, a television set, a video camcorder, a viewfinder- or monitor-equipped camcorder, a laptop personal computer, a car navigation system, a pager, an electronic organizer (with or without a communication facility), an electronic dictionary, a calculator, an electronic game machine, a word processor, a workstation, a video phone, a security monitor, electronic binoculars, a POS (point of sale) terminal, a device having a touch panel (such as a cash dispenser of a financial institution or an automatic ticket machine), a medical equipment (such as an electronic thermometer, a sphygmomanometer, a blood glucose meter, an electrocardiograph display, medical ultrasound equipment, and an endoscope display), a fish finder, a variety of measurement equipment, a variety of instruments (such as those used for cars, aircrafts, and ships), a flight simulator, a variety of other monitors, and a projection type display such as a projector.

Although the light-emitting device, the display device, and the electronic apparatus according to embodiments of the invention have been described on the basis of the embodiments with reference to the accompanying drawings, embodiments of the invention are not limited to the embodiments described above.

For example, the carrier generation layer may be provided between the light-emitting units, and in cases where each of the light-emitting units includes two or more additional light-emitting layers, the carrier generation layer may be additionally provided between such light-emitting layers.

EXAMPLES

Examples of embodiments of the invention will be specifically described.

1. Manufacturing Yellow Light-Emitting Device

First Example

First Process

A transparent glass substrate having an average thickness of 0.5 mm was prepares. An ITO electrode (anode) was formed on the substrate by a spattering technique so as to have an average thickness of 100 nm.

The substrate was dipped in acetone and then in 2-propanol and was subjected to ultrasonic cleaning. Then, the resultant substrate was subjected to oxygen plasma processing.

Second Process

Subsequently, a first hole transport layer was formed on the ITO electrode by a vacuum deposition method so as to have an average thickness of 50 nm, the first hole transport layer being made of N,N'-di(1-naphthyl)-N,N'-diphenyl-1,1'-diphenyl-4,4'-diamine (NPD).

Third Process

Subsequently, a yellow light-emitting layer was formed on the first hole transport layer by a vacuum deposition method so as to have an average thickness of 30 nm, the yellow light-emitting layer containing the following materials.

The materials of the yellow light-emitting layer employed a rubrene material as a yellow light-emitting material (guest material) and employed N,N'-di(1-naphthyl)-N,N'-diphenyl-1,1'-diphenyl-4,4'-diamine (NPD) as a host material. The amount (dopant concentration) of the yellow light-emitting material (dopant) contained in the light-emitting layer was configured to be 5.0 wt %.

Fourth Process

Subsequently, a first electron transport layer was formed on the yellow light-emitting layer by a vacuum deposition method so as to have an average thickness of 30 nm, the first electron transport layer being made of tris(8-quinolinolato)aluminum ($Alq_3$).

Fifth Process

Subsequently, an n-type electron transport layer was formed on the first electron transport layer by a vacuum deposition method so as to have an average thickness of 15 nm, the n-type electron transport layer containing the following material.

The material of the n-type electron transport layer employed a mixed material of tris(8-quinolinolato)aluminum ($Alq_3$) and lithium oxide ($Li_2O$). The amount of the lithium oxide ($Li_2O$) contained in the mixed material was configured to be 2% (volume ratio).

Sixth Process

Subsequently, an electron-withdrawing layer was formed on the n-type electron transport layer by a vacuum deposition method so as to have an average thickness of 15 nm, the electron-withdrawing layer containing the following material.

The material of the electron-withdrawing layer employed LG101 (commercially available from LG Chem. Ltd.).

Seventh Process

Subsequently, a second hole transport layer was formed on the electron-withdrawing layer by a vacuum deposition method so as to have an average thickness of 30 nm, the second hole transport layer being made of N,N'-di(1-naphthyl)-N,N'-diphenyl-1,1'-diphenyl-4,4'-diamine (NPD).

Eighth Process

Subsequently, a yellow light-emitting layer was formed on the second hole transport layer by a vacuum deposition method so as to have an average thickness of 30 nm, the yellow light-emitting layer containing the following materials.

The materials of the yellow light-emitting layer employed a rubrene material as a yellow light-emitting material (guest material) and employed N,N'-di(1-naphthyl)-N,N'-diphenyl-1,1'-diphenyl-4,4'-diamine (NPD) as a host material. The amount (dopant concentration) of the yellow light-emitting material (dopant) contained in the light-emitting layer was configured to be 5.0 wt %.

Ninth Process

Subsequently, a second electron transport layer was formed on the yellow light-emitting layer by a vacuum deposition method so as to have an average thickness of 50 nm, the second electron transport layer being made of tris(8-quinolinolato)aluminum ($Alq_3$).

Tenth Process

Subsequently, an electron injection layer was formed on the second electron transport layer by a vacuum deposition method so as to have an average thickness of 1 nm, the electron injection layer being made of lithium fluoride (LiF).

Eleventh Process

Subsequently, a cathode was formed on the electron injection layer by a vacuum deposition method so as to have an average thickness of 100 nm, the cathode being made of Al.

Twelfth Process

A protective cover (sealing member) made of glass was provided so as to cover the formed layers and then was fixed by using an epoxy resin to provide sealing.

Through these processes, a light-emitting device having a configuration illustrated in FIG. 1 was manufactured.

Second Example

In the fifth process, the material of the n-type electron transport layer employed a mixed material of tris(8-quinolinolato)aluminum ($Alq_3$) and lithium oxide ($Li_2O$), and the amount of the lithium oxide ($Li_2O$) contained in the mixed material was configured to be 0.5% (volume ratio). The other process configurations were provided as in the case of the first example, thereby manufacturing a light-emitting device.

Third Example

In the fifth process, the material of the n-type electron transport layer employed a mixed material of tris(8-quinolinolato)aluminum ($Alq_3$) and lithium oxide ($Li_2O$), and the amount of the lithium oxide ($Li_2O$) contained in the mixed material was configured to be 15% (volume ratio). The other process configurations were provided as in the case of the first example, thereby manufacturing a light-emitting device.

Fourth Example

In the fifth process, the material of the n-type electron transport layer employed a mixed material of tris(8-quinolinolato)aluminum ($Alq_3$) and lithium oxide ($Li_2O$). The amount of the lithium oxide ($Li_2O$) contained in the mixed material was gradually increased from the side of the electron transport layer toward the side of the electron-withdrawing layer such that the content of 0.5% (volume ratio) was provided at an interface with the electron transport layer and such that the content of 2.0% (volume ratio) was provided at an interface with the electron-withdrawing layer. The other process configurations were provided as in the case of the first example, thereby manufacturing a light-emitting device.

First Comparative Example

In the fifth process, a layer made of tris(8-quinolinolato) aluminum ($Alq_3$) (with a thickness of 14 nm) was formed on the side of the electron transport layer by a vacuum deposition method, and a layer made of Li (with a thickness of 1 nm) was formed on the side of the electron-withdrawing layer by a vacuum deposition method. Such two layers formed the n-type electron transport layer, and the other process configurations were provided as in the case of the first example, thereby manufacturing a light-emitting device.

Second Comparative Example

In the fifth process, a layer made of lithium oxide ($Li_2O$) was formed on the side of the electron-withdrawing layer by a vacuum deposition method in place of the layer made of Li. The other process configurations were provided as in the case of the first comparative example, thereby manufacturing a light-emitting device.

Third Comparative Example

In the fifth process, the material of the n-type electron transport layer employed a mixed material of tris(8-quinolinolato)aluminum ($Alq_3$) and Li, and the amount of Li contained in the mixed material was configured to be 2.0% (volume ratio). The other process configurations were provided as in the case of the first comparative example, thereby manufacturing a light-emitting device.

Fourth Comparative Example

In the fifth process, the material of the n-type electron transport layer employed a mixed material of tris(8-quinolinolato)aluminum ($Alq_3$) and lithium carbonate, and the amount of the lithium carbonate contained in the mixed material was configured to be 2.0% (volume ratio). The other process configurations were provided as in the case of the first comparative example, thereby manufacturing a light-emitting device.

2. Evaluation

In each of the light-emitting devices of the examples and comparative examples, an electric current having a current density of 10 mA/cm$^2$ was supplied from a direct-current power source between the anode and cathode, and a voltage applied to each of the light-emitting devices and current efficiency of light emitted from the light-emitting device were measured.

Furthermore, in each of the light-emitting devices of the examples and comparative examples, a constant current is applied to the light-emitting device so as to provide a luminance of 10,000 cd/m$^2$, and then time (LT80) at which the luminance was decreased to 80% of the initial luminance was measured. Then, the measured values were defined on the basis of the time measured in the first comparative example. The results are indicated in Table 1.

TABLE 1

| | n-type Electron Transport Layer | | Electron-Withdrawing Layer | | Voltage (V) | Current Efficiency (cd/A) | Lifetime (LT80) defined on the basis of first comparative example |
|---|---|---|---|---|---|---|---|
| | Material | Thickness (nm) | Material | Thickness (nm) | | | |
| First Example | $Alq_3$ + $Li_2O$ (2.0%) | 15 | LG101 | 15 | 10.3 | 10.5 | 1.9 |
| Second Example | $Alq_3$ + $Li_2O$ (0.5%) | | | | 10.8 | 11.0 | 1.7 |
| Third Example | $Alq_3$ + $Li_2O$ (15.0%) | | | | 12.5 | 8.5 | 1.2 |
| Fourth Example | $Alq_3$ + $Li_2O$ (0.5 to 2.0%) | | | | 10.1 | 12.5 | 2.1 |
| First Comparative Example | two-layered structure of $Alq_3$ (thickness of 14 nm) and Li (thickness of 1 nm) | | | | 13.8 | 11.3 | 1.0 |
| Second Comparative Example | two-layered structure of $Alq_3$ (thickness of 14 nm) and $Li_2O$ (thickness of 1 nm) | | | | 13.5 | 11.1 | 1.1 |
| Third Comparative Example | $Alq_3$ + Li (2.0%) | 15 | | | 10.3 | 10.9 | 1.2 |
| Fourth Comparative Example | $Alq_3$ + $LiCO_3$ (2.0%) | | | | 10.3 | 10.9 | 0.8 |

As being obvious in Table 1, in each of the light-emitting devices of the examples, the n-type electron transport layer that was included in the carrier generation layer contained the alkali metal oxide and the electron-transporting material, and therefore each of the light-emitting devices to be produced was capable of prolonging a lifetime. In this case, each of the light-emitting devices of the examples had excellent light emission efficiency regardless of such a configuration of the carrier generation layer.

Such an advantageous effect was significantly confirmed in the light-emitting device of the fourth example in which the alkali metal oxide was distributed entirely in the n-type electron transport layer.

On the other hand, each of the light-emitting devices of the comparative examples had decreased durability (lifetime characteristic) as compared with each of the light-emitting devices of the examples.

3. Manufacturing White Light-Emitting Device

Fifth Example

First Process

First, a transparent glass substrate having an average thickness of 0.5 mm was prepared. An ITO electrode (anode) was formed on the substrate by a spattering technique so as to have an average thickness of 100 nm.

The substrate was dipped in acetone and then in 2-propanol and was subjected to ultrasonic cleaning. Then, the resultant substrate was subjected to oxygen plasma processing.

Second Process

Subsequently, a first hole transport layer was formed on the ITO electrode by a vacuum deposition method so as to have an average thickness of 50 nm, the first hole transport layer being made of N,N'-di(1-naphthyl)-N,N'-diphenyl-1,1'-diphenyl-4,4'-diamine (NPD).

Third Process

Subsequently, a red light-emitting layer was formed on the first hole transport layer by a vacuum deposition method so as to have an average thickness of 10 nm, the red light-emitting layer containing the following materials.

The materials of the red light-emitting layer employed tris(1-phenylisoquinoline-$C^2$,N)iridium(III) [Ir(piq)$_3$], which is an Ir metallic complex and is represented by the formula 7, as a red light-emitting material (guest material) and employed 4,4'-N,N'-dicarbazole-biphenyl (CBP), which is represented by the formula 8, as a host material. The amount (dopant concentration) of the red light-emitting material (dopant) contained in the light-emitting layer was configured so as to be 10 wt %.

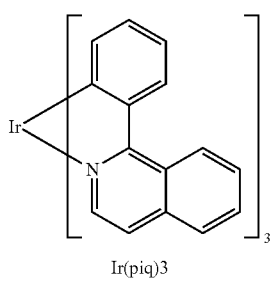

Ir(piq)3

(7)

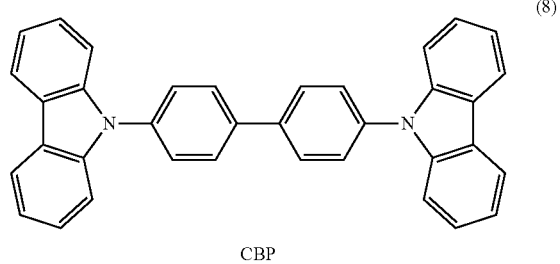

CBP (8)

Fourth Process

Subsequently, a green light-emitting layer was formed on the red light-emitting layer by a vacuum deposition method so as to have an average thickness of 30 nm, the green light-emitting layer containing the following materials The materials of the green light-emitting layer employed Ir(ppy)$_3$, which is an Ir metallic complex and is represented by the formula 9, as a green light-emitting material (guest material) and employed the CBP, which is represented by the formula 8, as a host material. The amount (dopant concentration) of the green light-emitting material (dopant) contained in the light-emitting layer was configured to be 10 wt %.

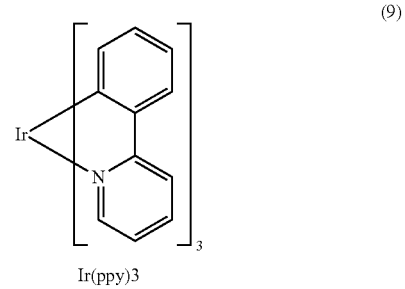

Ir(ppy)3

(9)

Fifth Process

Subsequently, a first electron transport layer was formed on the green light-emitting layer by a vacuum deposition method so as to have an average thickness of 30 nm, the first electron transport layer being made of tris(8-quinolinolato)aluminum (Alq$_3$).

Sixth Process

Subsequently, an n-type electron transport layer was formed on the first electron transport layer by a vacuum deposition method so as to have an average thickness of 15 nm, the n-type electron transport layer containing the following material.

The material of the n-type electron transport layer employed a mixed material of tris(8-quinolinolato)aluminum (Alq$_3$) and lithium oxide (Li$_2$O), and the amount of the lithium oxide (Li$_2$O) contained in the mixed material was configured to be 2% (volume ratio).

Seventh Process

Subsequently, an electron-withdrawing layer was formed on the n-type electron transport layer by a vacuum deposition method so as to have an average thickness of 15 nm, the electron-withdrawing layer containing the following material.

The material of the electron-withdrawing layer employed LG101 (commercially available from LG Chem Ltd.).

Eighth Process

Subsequently, a second hole transport layer was formed on the electron-withdrawing layer by a vacuum deposition method so as to have an average thickness of 30 nm, the second hole transport layer being made of N,N'-di(1-naphthyl)-N,N'-diphenyl-1,1'-diphenyl-4,4'-diamine (NPD).

Ninth Process

Subsequently, a blue light-emitting layer was formed on the second hole transport layer so as to have an average thickness of 30 nm, the blue light-emitting layer containing the following materials.

The materials of the blue light-emitting layer employed the compound represented by the formula 6 as the blue light-emitting material (guest material) and employed 2-tert-butyl-9,10-di(2-naphthyl)anthracene (TBADN) represented by the formula 10 as a host material. The amount (dopant concentration) of the blue light-emitting material (dopant) contained in the light-emitting layer was configured to be 5.0 wt %

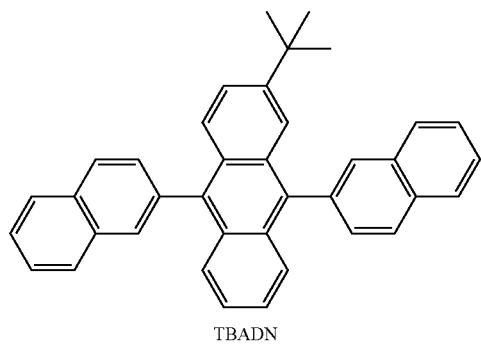

(10)

TBADN

Tenth Process

Subsequently, a second electron transport layer was formed on the blue light-emitting layer by a vacuum deposition method so as to have an average thickness of 50 nm, the second electron transport layer being made of tris(8-quinolinolato)aluminum ($Alq_3$).

Eleventh Process

Subsequently, an electron injection layer was formed on the second electron transport layer by a vacuum deposition method so as to have an average thickness of 1 nm, the electron injection layer being made of lithium fluoride (LiF).

Twelfth Process

Subsequently, a cathode was formed on the electron injection layer by a vacuum deposition method so as to have an average thickness of 100 nm, the anode being made of Al.

Thirteenth Process

A protective cover (sealing member) made of glass was provided so as to cover the formed layers and then was fixed by using an epoxy resin to provide sealing.

Through these processes, a light-emitting device having a configuration illustrated in FIG. 1 was manufactured.

As in the case of each of the light-emitting devices of the first to fourth examples, the light-emitting device of the fifth example was also subjected to measurement of: a voltage applied to the light-emitting device; current efficiency of light emitted from the light-emitting device; and LT80. As a result, the light-emitting device of the fifth example had excellent light-emitting properties and lifetime properties as well as the light-emitting devices of the first to fourth examples.

The entire disclosure of Japanese Patent Application No. 2009-270767, filed Nov. 27, 2009 is expressly incorporated by reference herein.

What is claimed is:

1. A light-emitting device comprising:
   an anode;
   a cathode;
   a first light-emitting unit provided between the anode and the cathode, the first light-emitting unit having at least one light-emitting layer that emits light in response to application of a voltage between the anode and the cathode;
   a second light-emitting unit provided between the cathode and the first light-emitting unit, the second light-emitting unit having at least one light-emitting layer that emits light in response to application of a voltage between the anode and the cathode; and
   a carrier generation layer provided between the first light-emitting unit and the second light-emitting unit, the carrier generation layer generating holes and electrons in response to application of a voltage between the anode and the cathode, wherein
   the carrier generation layer includes an n-type electron transport layer and an electron-withdrawing layer, the n-type electron transport layer being positioned between the first light-emitting unit and the electron-withdrawing layer, the electron-withdrawing layer contacting the n-type electron transport layer and containing organic cyanide having an aromatic ring, the organic cyanide being a hexaazatriphenylene derivative, and
   the n-type electron transport layer is a mixed material of tris (8-quinolinolato) aluminum and lithium oxide, an amount of the lithium oxide in the mixed material decreases from 2.0% of volume ratio at a side of the electron-withdrawing layer to 0.5% volume ratio at an another side.

2. The light-emitting device according to claim 1, wherein the n-type electron transport layer has an average thickness that is in the range from 5 to 60 nm.

3. The light-emitting device according to claim 1, wherein each of the first light-emitting unit and the second light-emitting unit includes a hole transport layer and an electron transport layer, the hole transport layer being positioned on the side of the anode, and the electron transport layer being positioned on the side of the cathode.

4. The light-emitting device according to claim 3, wherein the electron-transporting material contained in the n-type electron transport layer is any of similar and identical materials to an electron-transporting material contained in the electron transport layer included in the first light-emitting unit.

5. The light-emitting device according to claim 1, wherein the electron-withdrawing layer has an average thickness that is in the range from 5 nm to 40 nm.

6. A display device comprising the light-emitting device according to claim 1.

7. An electronic apparatus comprising the display device of claim 6.

8. The light-emitting device according to claim 1, wherein a thickness of the n-type electron transport layer is 15 nm.

* * * * *